United States Patent
Haba et al.

(10) Patent No.: US 9,214,454 B2
(45) Date of Patent: Dec. 15, 2015

(54) BATCH PROCESS FABRICATION OF PACKAGE-ON-PACKAGE MICROELECTRONIC ASSEMBLIES

(71) Applicant: Invensas Corporation, San Jose, CA (US)

(72) Inventors: Belgacem Haba, Saratoga, CA (US); Ilyas Mohammed, Santa Clara, CA (US); Liang Wang, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/230,388

(22) Filed: Mar. 31, 2014

(65) Prior Publication Data
US 2015/0279823 A1  Oct. 1, 2015

(51) Int. Cl.
| | |
|---|---|
| H01L 23/48 | (2006.01) |
| H01L 23/52 | (2006.01) |
| H01L 25/10 | (2006.01) |
| H01L 25/00 | (2006.01) |
| H01L 21/56 | (2006.01) |
| H01L 23/00 | (2006.01) |

(52) U.S. Cl.
CPC .............. *H01L 25/105* (2013.01); *H01L 21/56* (2013.01); *H01L 24/17* (2013.01); *H01L 24/81* (2013.01); *H01L 25/50* (2013.01)

(58) Field of Classification Search
CPC ........................ H01L 23/3114; H01L 23/3121
USPC ................... 257/778, 787, 774, 686, E23.145
See application file for complete search history.

(56) References Cited

U.S. PATENT DOCUMENTS

| | | |
|---|---|---|
| 3,289,452 A | 12/1966 | Koellner |
| 3,358,897 A | 12/1967 | Christensen |
| 3,623,649 A | 11/1971 | Keisling |
| 3,795,037 A | 3/1974 | Luttmer |
| 3,900,153 A | 8/1975 | Beerwerth et al. |

(Continued)

FOREIGN PATENT DOCUMENTS

| | | |
|---|---|---|
| CN | 102324418 A | 1/2012 |
| DE | 102005051414 | 4/2007 |

(Continued)

OTHER PUBLICATIONS

"EE Times Asia" [online]. [Retrieved Aug. 5, 2010]. Retrieved from internet.  <http://www.eetasia.com/ART_8800428222_480300_nt_dec52276.HTM>, 4 pages.

(Continued)

*Primary Examiner* — Nitin Parekh
(74) *Attorney, Agent, or Firm* — Lerner, David, Littenberg, Krumholz & Mentlik, LLP

(57) ABSTRACT

A microelectronic assembly can be made by joining first and second subassemblies by electrically conductive masses to connect electrically conductive elements on support elements of each subassembly. A patterned layer of photo-imageable material may overlie a surface of one of the support elements and have openings with cross-sectional dimensions which are constant or monotonically increasing with height from the surface of that support element, where the masses extend through the openings and have dimensions defined thereby. An encapsulation can be formed by flowing an encapsulant into a space between the joined first and second subassemblies.

12 Claims, 8 Drawing Sheets

(56) References Cited

U.S. PATENT DOCUMENTS

| | | |
|---|---|---|
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,202,298 B1 | 3/2001 | Smith |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,528,874 B1 | 3/2003 | Iijima et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,578,755 B1 | 6/2003 | Elenius et al. |
| 6,581,283 B2 | 6/2003 | Sugiura et al. |
| 6,600,234 B2 | 7/2003 | Kuwabara et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,930,256 B1 | 8/2005 | Huemoeller et al. |
| 6,933,608 B2 | 8/2005 | Fujisawa |

(56) References Cited

U.S. PATENT DOCUMENTS

| | | |
|---|---|---|
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,067,911 B1 | 6/2006 | Lin et al. |
| 7,087,995 B2 | 8/2006 | Hiatt et al. |
| 7,119,427 B2 | 10/2006 | Kim |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,621,436 B2 | 11/2009 | Mii et al. |
| 7,633,765 B1 | 12/2009 | Scanlan et al. |
| 7,642,133 B2 | 1/2010 | Wu et al. |
| 7,646,102 B2 | 1/2010 | Boon |
| 7,652,361 B1 | 1/2010 | Yoshida et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,919,846 B2 | 4/2011 | Hembree |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,039,970 B2 | 10/2011 | Yamamori et al. |
| 8,058,101 B2 | 11/2011 | Haba et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,304,900 B2 | 11/2012 | Jang et al. |
| 8,330,772 B2 | 12/2012 | Cote et al. |
| 8,482,111 B2 | 7/2013 | Haba |
| 8,525,314 B2 | 9/2013 | Haba et al. |
| 8,525,318 B1 | 9/2013 | Kim et al. |
| 8,641,913 B2 | 2/2014 | Haba et al. |
| 8,653,676 B2* | 2/2014 | Kim et al. ............... 257/790 |
| 8,779,606 B2 | 7/2014 | Yim et al. |
| 8,836,136 B2* | 9/2014 | Chau et al. ............... 257/774 |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0185735 A1 | 12/2002 | Sakurai et al. |
| 2003/0006494 A1 | 1/2003 | Lee et al. |
| 2003/0048108 A1 | 3/2003 | Beaman et al. |
| 2003/0057544 A1* | 3/2003 | Nathan et al. ............... 257/700 |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262734 A1 | 12/2004 | Yoo |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2007/0015353 A1 | 1/2007 | Craig et al. |
| 2007/0040264 A1 | 2/2007 | Hall et al. |
| 2007/0148822 A1 | 6/2007 | Haba et al. |
| 2007/0152313 A1* | 7/2007 | Periaman et al. ............... 257/686 |
| 2007/0181989 A1 | 8/2007 | Corisis et al. |
| 2007/0182012 A1 | 8/2007 | DeRaedt et al. |
| 2007/0190747 A1 | 8/2007 | Humpston et al. |

(56) References Cited

U.S. PATENT DOCUMENTS

| | | |
|---|---|---|
| 2007/0235850 A1 | 10/2007 | Gerber et al. |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0264899 A1 | 10/2008 | Hsu et al. |
| 2008/0284001 A1 | 11/2008 | Mori et al. |
| 2008/0284045 A1 | 11/2008 | Gerber et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0045497 A1 | 2/2009 | Kagaya et al. |
| 2009/0050994 A1 | 2/2009 | Ishihara et al. |
| 2009/0075428 A1* | 3/2009 | Tang et al. .................... 438/114 |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0152708 A1* | 6/2009 | Lee et al. .................... 257/690 |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0261466 A1 | 10/2009 | Pagaila et al. |
| 2009/0315579 A1 | 12/2009 | Beaman et al. |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0072634 A1 | 3/2010 | Ha et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0140771 A1 | 6/2010 | Huang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0314748 A1 | 12/2010 | Hsu et al. |
| 2010/0320622 A1* | 12/2010 | Machida ........................ 257/778 |
| 2010/0327419 A1 | 12/2010 | Muthukumar et al. |
| 2011/0039370 A1 | 2/2011 | Gomyo et al. |
| 2011/0068453 A1 | 3/2011 | Cho et al. |
| 2011/0115081 A1 | 5/2011 | Osumi |
| 2011/0117700 A1 | 5/2011 | Weng et al. |
| 2011/0140259 A1 | 6/2011 | Cho et al. |
| 2011/0147911 A1 | 6/2011 | Kohl et al. |
| 2011/0241193 A1 | 10/2011 | Ding et al. |
| 2011/0256662 A1 | 10/2011 | Yamano et al. |
| 2011/0272449 A1 | 11/2011 | Pirkle et al. |
| 2011/0316155 A1 | 12/2011 | Ko et al. |
| 2012/0013001 A1 | 1/2012 | Haba |
| 2012/0015481 A1 | 1/2012 | Kim |
| 2012/0038040 A1 | 2/2012 | Jang et al. |
| 2012/0043655 A1 | 2/2012 | Khor et al. |
| 2012/0061814 A1 | 3/2012 | Camacho et al. |
| 2012/0086130 A1 | 4/2012 | Sasaki et al. |
| 2012/0119380 A1 | 5/2012 | Haba |
| 2012/0168917 A1 | 7/2012 | Yim et al. |
| 2012/0280386 A1 | 11/2012 | Sato et al. |
| 2013/0015586 A1 | 1/2013 | Crisp et al. |
| 2013/0043584 A1 | 2/2013 | Kwon et al. |
| 2013/0082389 A1 | 4/2013 | Crisp et al. |

FOREIGN PATENT DOCUMENTS

| | | |
|---|---|---|
| EP | 920058 | 6/1999 |
| EP | 2234158 A1 | 9/2010 |
| JP | 61125062 A | 6/1986 |
| JP | 62-226307 | 10/1987 |
| JP | 1012769 A | 1/1989 |
| JP | 64-71162 | 3/1989 |
| JP | 06268015 A | 9/1994 |
| JP | 07-122787 A | 5/1995 |
| JP | 11-074295 A | 3/1999 |
| JP | 11135663 A | 5/1999 |
| JP | 11251350 A | 9/1999 |
| JP | 2001196407 A | 7/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2003426392 A | 7/2005 |
| JP | 2005183880 A | 7/2005 |
| JP | 2005203497 A | 7/2005 |
| JP | 2005302765 A | 10/2005 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |

(56) References Cited

FOREIGN PATENT DOCUMENTS

| KR | 2001-0094894 A | 11/2001 |
|---|---|---|
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| TW | 200933760 A | 8/2009 |
| TW | 201023277 A | 6/2010 |
| WO | 02/13256 A1 | 2/2002 |
| WO | 2006050691 A2 | 5/2006 |
| WO | 2008065896 A1 | 6/2008 |

OTHER PUBLICATIONS

"Wafer Level Stack—WDoD", [online]. [Retrieved Aug. 5, 2010]. Retrieved from the internet. <http://www.3d-plus.com/techno-wafer-level-stack-wdod.php>, 2 pages.
Extended European Search Report for Application No. EP13162975 dated Sep. 5, 2013.
International Search Report and Written Opinion for Application No. PCT/US2011/044346 dated May 11, 2012.
International Search Report and Written Opinion for Application No. PCT/US2012/060402 dated Apr. 2, 2013.
International Search Report and Written Opinion for Application No. PCT/US2013/026126 dated Jul. 25, 2013.
International Search Report and Written Opinion for Application No. PCT/US2013/041981 dated Nov. 13, 2013.
International Search Report and Written Opinion for Application No. PCT/US2013/052883 dated Oct. 21, 2013.
International Search Report and Written Opinion for Application No. PCT/US2013/053437 dated Nov. 25, 2013.
International Search Report and Written Opinion for PCT/US2011/060551 dated Apr. 18, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, Apr. 5, 2006.
Japanese Office Action for Application No. 2013-509325 dated Oct. 18, 2013.
Jin, Yonggang et al., "STM 3D-IC Package and 3D eWLB Development," STMicroelectronics Singapore/STMicroelectronics France May 21, 2010.
Kim et al., "Application of Through Mold Via (TMV) as PoP base package", 6 pages (2008).
Korean Office Action for Application No. 10-2011-0041843 dated Jun. 20, 2011.
Korean Search Report KR10-2011-0041843 dated Feb. 24, 2011.
Meiser S, "Klein und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking,"IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action for Taiwan Application No. 100125521 dated Dec. 20, 2013.
Office Action from Taiwan for Application No. 100125522 dated Jan. 27, 2014.
Office Action from U.S. Appl. No. 12/769,930 mailed May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Applicatin No. 10-2010-0113271 dated Jan. 12, 2011.
U.S. Appl. No. 13/942,568, filed Jul. 15, 2013.
U.S. Appl. No. 10/656,534, filed Sep. 5, 2003.
Yoon, PhD, Seung Wook, "Next Generation Wafer Level Packaging Solution for 3D integration," May 2010, Stats ChipPAC Ltd.
International Search Report and Written Opinion for Application No. PCT/US2014/046661 dated Jan. 7, 2015.
International Search Report and Written Opinion for Application No. PCT/US2015/022816 dated Jul. 7, 2015.

* cited by examiner

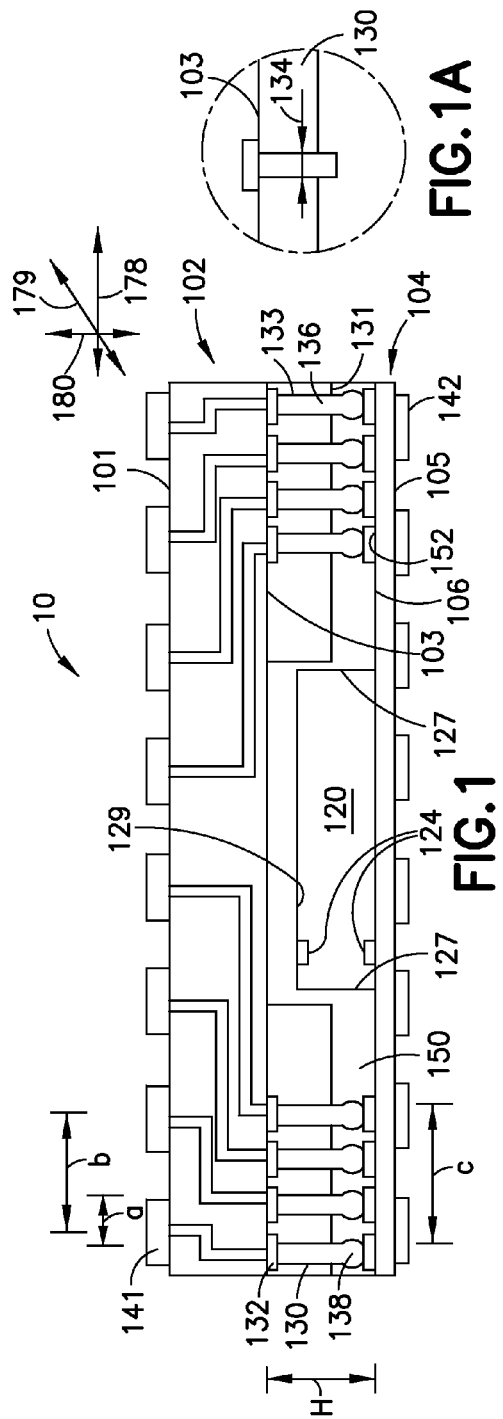
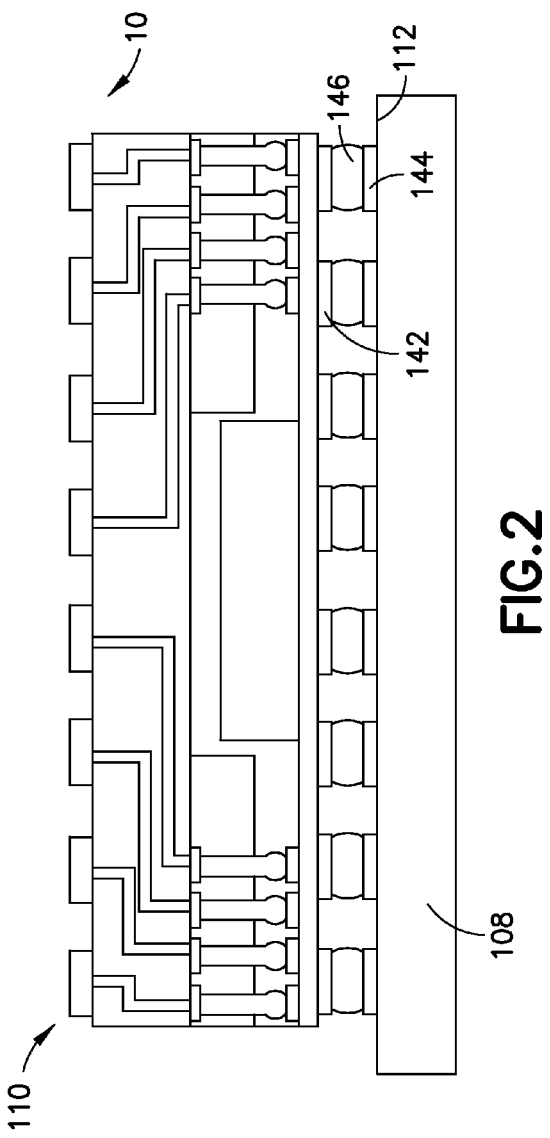

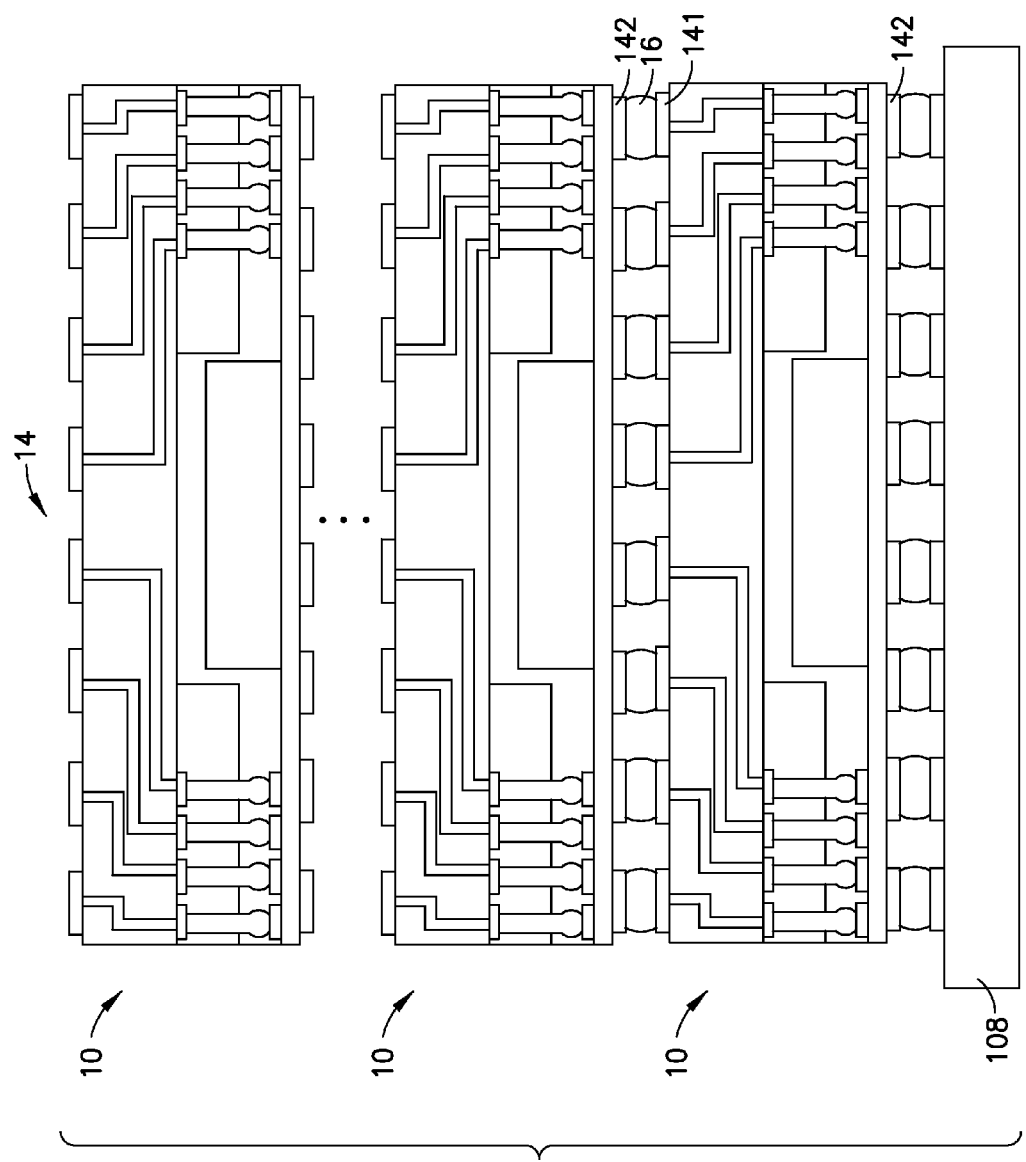

BATCH PROCESS FABRICATION OF PACKAGE-ON-PACKAGE MICROELECTRONIC ASSEMBLIES

BACKGROUND OF THE INVENTION

The present invention relates to packaging of microelectronic elements, especially the packaging of semiconductor chips.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron (μm) thick. The bond pads could include a single layer or multiple layers of metal. The size of the bond pads will vary with the device type but will typically measure tens to hundreds of microns on a side.

Microelectronic elements such as semiconductor chips typically require many input and output connections to other electronic components. The input and output contacts of a semiconductor chip or other comparable device are generally disposed in grid-like patterns that substantially cover a surface of the chip (commonly referred to as an "area array") or in elongated rows which may extend parallel to and adjacent each edge of the chip's front surface, or in the center of the front surface. Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

Size is a significant consideration in any physical arrangement of chips. The demand for more compact physical arrangements of chips has become even more intense with the rapid progress of portable electronic devices. Merely by way of example, portable devices commonly referred to as "smart phones" and tablets integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made, further improvements can be made to enhance microelectronic package structures having stack terminals and processes for making such packages.

BRIEF SUMMARY OF THE INVENTION

In accordance with an aspect of the invention, a microelectronic assembly is provided which can comprise first and second support elements each having a first surface facing in an outwardly direction of the assembly and each having a second surface facing in an inwardly direction of the assembly towards the second surface of the other of the first and second support elements. The microelectronic assembly may have at least one of: first terminals at the first surface of the first support element, or second terminals at the first surface of the second support element. Electrically conductive first elements can be provided at the second surface of the first support element. A patterned layer of photo-imageable material may overlie the second surface of the first support element and have openings aligned with the first elements. In one example, each opening may have a cross-sectional dimension which is constant or increasing with a height from the second surface of the first support element. Electrically conductive masses of bonding material may be electrically coupled with and project above the first elements through the corresponding openings of the patterned layer. Each mass may have a cross-sectional dimension which is defined by a cross-sectional dimension of the corresponding opening through which it projects. A microelectronic element can be mounted to the second surface of one of the first or the second support elements. Electrically conductive second elements can be provided at the second surface of the second support element, and can be electrically coupled with the masses and electrically coupled with the first elements through the masses. An encapsulation may overlie the second surface of the second support element, a surface of the patterned layer and may contact at least some of the masses, with the masses extending through at least a portion of the encapsulation. In a particular example, the masses may have bulbous portions where the masses extend through the at least a portion of the encapsulation.

A stacked multi-chip microelectronic assembly in accordance with an aspect of the invention may include the microelectronic assembly and a microelectronic package overlying the first surface of the first support element, with the microelectronic package having terminals connected with the first terminals of the microelectronic assembly.

A stacked multi-chip microelectronic assembly in accordance with a particular aspect of the invention may include the microelectronic assembly and have second terminals but not the first terminals. The second terminals may be electrically coupled with the first elements through the masses therebetween.

A method of fabricating a microelectronic assembly in accordance with an aspect of the invention may comprise joining first and second subassemblies to form an assembly. The assembly can comprise a first support element and a second support element, the first support element having an outwardly-facing first surface facing a first direction, and the second support element having an outwardly-facing first surface facing a second direction opposite from the first direction. The first support element may have electrically conductive first elements at an inwardly-facing second surface thereof, and the second support element may have electrically conductive second elements at an inwardly-facing second surface thereof, and at least one microelectronic element may be mounted overlying the second surface of one of the first and second support elements. The assembly may further include a patterned layer of photo-imageable material overlying the second surface of one of the first or second support elements, the patterned layer having openings with cross-sectional dimensions which are constant or increase with height from the surface of the support element over which the patterned layer lies. The assembly may further comprise masses of bonding material extending from the first elements through the openings and electrically coupled with the second elements, the masses having cross-sectional dimensions defined by the cross-sectional dimensions of the openings.

After forming the assembly, a encapsulant can be flowed into a space between the first and second subassemblies to form an encapsulation contacting surfaces of at least portions of the masses.

In accordance with such method, the assembly may comprise first terminals at the first surface of the first support element, and second terminals at the first surface of the second support element, the first terminals being electrically coupled with the second terminals through the first elements, the second elements, and the masses therebetween.

Alternatively, in accordance with such method, the assembly may include one of: first terminals at the first surface of the first support element, the first terminals being electrically coupled with the second elements through the masses therebetween; or second terminals at the first surface of the second support element, the second terminals being electrically coupled with the first elements through the masses therebetween.

In accordance with a particular aspect, the method may further comprise forming the patterned layer by depositing a first layer of photo-imageable material, and depositing a temporary layer comprising a second layer of a photo-imageable material, photolithographically patterning the temporary layer to form apertures, using the patterned temporary layer to pattern the first layer to form the openings in accordance with the apertures in the temporary layer, then filling the openings with the masses, and then removing the temporary layer such that the masses project to heights greater than a height of the first layer above the second surface of the support element over which it lies.

BRIEF DESCRIPTION OF THE SEVERAL VIEWS OF THE DRAWINGS

FIG. 1 is a sectional view illustrating a microelectronic assembly in accordance with an embodiment of the invention.

FIG. 1A is a partial fragmentary sectional view further illustrating an aspect of the microelectronic assembly depicted in FIG. 1.

FIG. 2 is a sectional view illustrating a microelectronic assembly in accordance with an embodiment of the invention as coupled with an additional component such as a circuit panel.

FIG. 3 is a sectional view illustrating a stacked multi-chip assembly comprising a plurality of stacked electrically coupled microelectronic assemblies, such as a plurality of the microelectronic assemblies seen in FIG. 1.

FIGS. 5 through 12 are sectional views illustrating stages in fabrication of a microelectronic assembly in accordance with an embodiment of the invention, in which:

FIG. 6 illustrates a stage following the stage depicted in FIG. 5;

FIG. 7 illustrates a stage following the stage depicted in FIG. 6;

FIG. 8 illustrates a stage following the stage depicted in FIG. 7;

FIG. 9 illustrates a stage following the stage depicted in FIG. 8;

FIG. 10 illustrates a stage following the stage depicted in FIG. 9;

FIG. 11 illustrates a stage following the stage depicted in FIG. 10; and

FIG. 12 illustrates a stage in a method of fabricating a microelectronic assembly in accordance with a variation of the embodiment depicted in FIGS. 6-11.

DETAILED DESCRIPTION OF THE INVENTION

Figure 4:
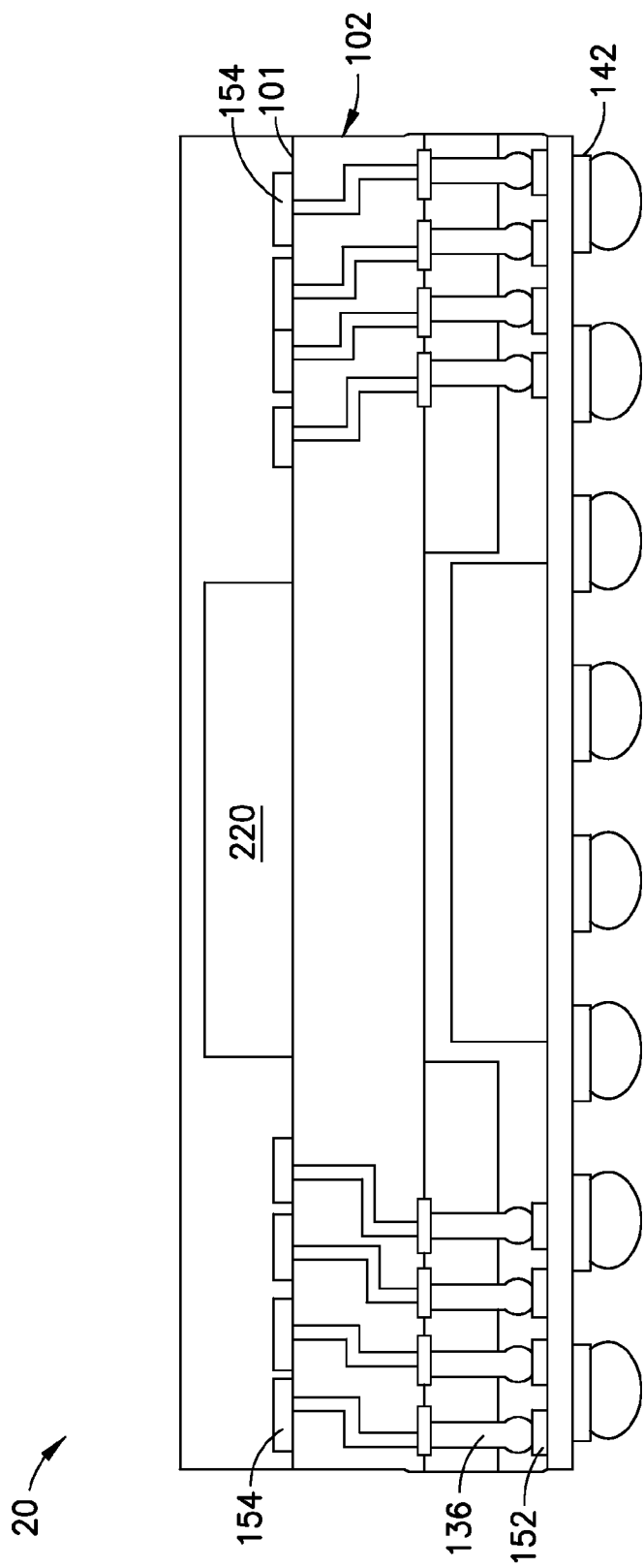
FIG. 4 is a sectional view illustrating a microelectronic assembly in accordance with a variation of the embodiment of the invention depicted in FIG. 1.

Accordingly, embodiments of the invention herein can provide improved assemblies containing microelectronic elements and having first terminals and second terminals, e.g., top terminals and bottom terminals, in which vertical interconnects which electrically couple the top terminals and bottom terminals provides desirable standoff height while also allowing the vertical interconnects to be tightly packed with desirable pitch in horizontal directions parallel to a face of the microelectronic element in the assembly. Referring to the microelectronic assembly 10 or microelectronic package illustrated in FIG. 1, in one example, a standoff height H between the second surfaces of the support elements is greater than half a minimum pitch "a" of masses 136 of bonding material in at least one direction parallel to the second surface of the first support element. In other examples, the standoff height can be equal to or greater than the minimum pitch a, or may be equal to or greater than 1.5 times the minimum pitch a.

As further seen in FIG. 1, the microelectronic package 10 includes a first support element 102 and a second support element 104. Each support element can be, e.g., a package substrate such as a chip carrier or dielectric element or structure which combines two or more of dielectric, semiconductor and electrically conductive materials on which electrically conductive structure such as terminals, traces, contacts, and vias can be provided. For example, one or both support elements can be or include a sheet-like or board-like dielectric element which comprises at least one of inorganic or organic dielectric material, and which may include primarily inorganic material, or primarily polymeric material, or which may be a composite structure comprising both inorganic and polymeric materials. Thus, for example, without limitation, one or both support elements may comprise a dielectric element which includes polymeric material such as polyimide, polyamide, epoxy, thermoplastic material, thermoset materials, among others. Alternatively, one or both support elements may comprise a dielectric element which includes an inorganic dielectric material such as an oxide of silicon, a nitride of silicon, a carbide of silicon, silicon oxynitride, alumina, and one or both support elements can include a semiconductor material such as silicon, germanium, or carbon, among others, or a combination of one or more such inorganic materials. In another example, one or both support elements can comprise a dielectric element which is a combination of one or more polymeric materials and one or more inorganic materials, such as the materials described above. In specific examples, one or both support elements can have a structure of glass-reinforced epoxy such as commonly referred to as "FR-4" or "BT resin" board structures. In another example, one or both support elements may consist essentially of polymeric material such as polyimide, for example. One or both support elements may include one or more layers of compliant material, which in some cases may be exposed at the first surface, the second surface, or both the first and second surfaces of such support element. The compliant material in some cases can comprise polyimide, polyamide which typically have Young modulus less than 2.0 gigapascals ("GPa"), or in some cases the compliant material may include an elastomer having a Young's modulus which is significantly lower, e.g., well below 1.0 GPa.

As seen in FIG. 1, each support element has first and second oppositely facing surfaces. As assembled in a microelectronic assembly 10 or microelectronic package, first surfaces 101, 105 of the support elements face outwardly away from one another, and the second surfaces 103, 106 face inwardly towards one another. A microelectronic element 120 which may be an unpackaged or packaged semiconductor chip is mounted to the second surface of one or both of the support elements 102, 104. In a particular embodiment, the microelectronic element can be a semiconductor chip having additional electrically conductive structure at a face thereof coupled to pads of the chip. Although not shown, in one embodiment, a second microelectronic element can be mounted in a space above a surface 129 of the microelectronic element 120 which faces away from support element 104. The second microelectronic element can be positioned between surface 129 and the surface 103 of the first support element 102. The second microelectronic element can be mounted to a surface 103 of the first support element 102 and be electrically coupled with the first elements 132. Alternatively, the second microelectronic element can be electrically coupled with conductive elements at a surface 106 of the second support element 104. A second encapsulation (not shown) may be provided on or overlying one or more of edge surfaces or a face of the second microelectronic element.

In a particular embodiment, the first support element 102 can be referred to as an "interposer", particularly when the first support element 102 has electrically conductive first elements 132 at the second surface 103 thereof which are disposed in a different pattern, e.g., at different locations or a different pitch, than a set of first terminals 141 at the first surface of the interposer 102. As further seen in FIG. 1, in one example, a minimum pitch "a" of the first elements 132 can be significantly smaller than a minimum pitch "b" of the first terminals 141. The first terminals 141 may have a same or different minimum pitch "b" than a minimum pitch "c" of second terminals 142 at an oppositely-facing surface 105 of microelectronic assembly 10. A microelectronic assembly 10 having the same pitch for first terminals 141 and second terminals 142 can be utilized, for example, in a higher-level assembly comprising a plurality of stacked and electrically coupled microelectronic assemblies 10 as seen in FIG. 3.

As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate. In one example, the "surface" of the component may be a surface of dielectric structure; however, in particular embodiments, the surface may be a surface of other material such as metal or other electrically conductive material or semiconductor material.

In FIG. 1, the directions parallel to the first surface 101 of the first support element are referred to herein as first and second transverse directions 178, 179 or "horizontal" or "lateral" directions, whereas the directions 180 perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Referring to FIG. 1, in one example, a "front" contact-bearing face of the microelectronic element 120 may face downwardly toward second surface 106 of the second support element 104, and a plurality of contacts 124 at the front face of the microelectronic element may face and be electrically coupled with corresponding contacts at the surface 106 of the second support element, such as seen in FIG. 1A of commonly owned U.S. application Ser. No. 13/942,568 filed Jul. 15, 2013 (hereinafter, "the '568 application"), the disclosure of which is incorporated herein by reference. In a particular example, as seen, for example, in commonly owned U.S. application Ser. No. 13/439,299 filed Apr. 4, 2012 (hereinafter, "the '299 application") the disclosure of which is incorporated herein by reference, the contacts can be distributed across at least a portion of the front face of the microelectronic element in an area array having two or more rows of contacts and having two or more columns of contacts. An underfill may be disposed between the front face of the microelectronic element and second surface 106 of the second support element, the underfill surrounding individual ones of the connections, and which in some cases may mechanically reinforce the connections. The contacts 124 of the microelectronic element 120 may be electrically coupled with electrically conductive second terminals 142 at the first surface 105 of the second support element. In such example, the contacts 124 can be electrically coupled with corresponding contacts at the second surface 106 facing the contacts 124 by a flip-chip connection, i.e., by a bond metal, e.g., tin, indium, solder or a eutectic material, or a conductive matrix material of metal particles embedded in a polymeric material.

Alternatively, instead a flip-chip connection, the contacts (not shown) on the downwardly-oriented front face can be arranged at positions within one or more rows of contacts and/or one or more columns of contacts which are aligned with an aperture or "bond window" (not shown) that extends between the first and second surfaces 105, 106 of the support element 104. In such case, the contacts 124 of the microelectronic element can be coupled with the second terminals 142 through leads which are joined to the contacts, such as seen, for example in any one or more of FIGS. 1A-1C, 5B-5C, and 9A-15 of U.S. application Ser. No. 13/306,068 filed Nov. 29, 2011, the disclosure of which is incorporated herein by reference. In a particular example, the leads can be wire leads (not shown), e.g., wire bonds, which extend through the aperture and are joined to the contacts and to corresponding contacts (not shown) at the first surface 105. In another example, the leads can be leads each of which includes a first portion extending as a trace along the first or second surfaces 105, 106 and a second portion integral with the first portion which extends from the trace into the area of the aperture and is joined to the contact.

In still another example, although not shown, a rear surface of the microelectronic element can be back-bonded to the second surface 106 of the second support element and the front (contact-bearing) face of the microelectronic can instead face away from the first surface 106 of support element 104, with contacts 124' of the microelectronic element facing away from the second surface 106. In such example, the contacts 124' can be electrically coupled with corresponding contacts at the second surface 106 by conductive structure extending above the contact-bearing face 129 at which contacts 124' are disposed. For example, wire bonds, leads, ribbon bonds, among others, may be used to provide the conductive interconnections.

As further seen in FIG. 1, the microelectronic package 10 can include a patterned layer 130 of photo-imageable material having a surface 131 at a height above the second surface 103 of the first support element. As further seen in FIG. 1, the patterned layer 130 has a plurality of openings 133 which are aligned with corresponding electrically conductive first elements 132 at the second surface 103 of the first support element 102. Referring to FIG. 1A, each of the plurality of openings has a cross-sectional dimension 134 which is either constant or monotonically increasing with height from the second surface 103 of the first support element.

As further seen in FIG. 1, electrically conductive masses 136 of bonding material are electrically coupled with the first elements 132 and project away from the first elements 132 through the corresponding openings 133 of the patterned layer. In one example, the masses can comprise a bond metal, e.g., tin, indium, solder or a eutectic material. In other examples, the masses can comprise an electrically conductive matrix material of metal particles embedded in a polymeric material. In one example, the masses may have a vertical height of between 20 and 500 micrometers (hereinafter "microns") in a vertical direction 180 of the microelectronic assembly. The vertical dimension of each post typically is greater than half the minimum on-center pitch "a" of adjacent first elements 132 in a second direction 178 or 179 which is parallel to a plane in which a surface 103 of the first support element extends.

Within the patterned layer 130, each mass 136 has a cross-sectional dimension 134 which is defined by a cross-sectional dimension of the corresponding opening 130 through which it projects. Thus, the cross-sectional dimensions of the masses 136 are constant or monotonically increasing at least at heights within the patterned layer 130. The masses project above surface 131 of the patterned layer 130 and are joined with corresponding electrically conductive second elements 152 at a surface 106 of the second support element. As seen in FIG. 1, the masses 136 may have bulbous portions 138 where the masses extend between a surface 131 of the patterned layer and the second elements 152.

As further seen in FIG. 1, an encapsulation 150 may be formed in contact with the second surface 106 of the second support element 104 and may be formed in contact with the surface 131 of the patterned layer and with surfaces of the masses 136. In one embodiment, the encapsulation 150 may be formed in contact with edge surfaces 127 and major surface 129 of the microelectronic element 120. Alternatively, the encapsulation 150 may be formed in contact with one or more layers of material (not shown) overlying the edge surfaces 127 and/or may be formed in contact with one or more layers of material (not shown) overlying the major surface 129 of the microelectronic element 129, such that the encapsulation 150 overlies but does not contact either the edge surfaces 127, the major surface 129, or both the edge surfaces and the major surface of the microelectronic element 129. In one example, the one or more layers of material can be or can comprise a second encapsulation overlying one or more of the major surface 129 and one or more of the edge surfaces 127 of the microelectronic element 120.

The encapsulation 150 can include or consist essentially of a polymeric material. Examples of materials of which the encapsulation can be made are a potting compound, epoxies, liquid crystal polymers, thermoplastics, and thermoset polymers. In a particular example, the encapsulation can include a polymeric matrix and particulate loading material within the polymeric matrix, such as formed by molding or otherwise depositing an uncured polymeric material which has the particulate loading material therein onto a surface 131 of the patterned layer 130. In one example, the particulate loading material may optionally have a low coefficient of thermal expansion ("CTE"), such that the resulting encapsulation 150 may have a CTE lower than 10 parts per million per degree Celsius hereinafter, "ppm/° C.". In one example, the encapsulation may include a filler material such as glass or ceramic dielectric filler or semiconductor filler among others.

In a variation of any or all of the above-described embodiments, one of: the plurality of the first terminals, or the plurality of the second terminals can be omitted from the microelectronic assembly 10. In that case, the first elements may be electrically coupled with the second terminals through the electrically conductive masses 136 which are disposed therebetween, or the second elements may be electrically coupled with the first terminals through the electrically conductive masses 136 which are disposed therebetween. In one variation of any or all of the above-described embodiments, the microelectronic element 120 can be mounted to surface 103 of the first support element 102 instead of to surface 106 of the second support element 104.

FIG. 2 illustrates a board-level assembly 110 comprising a microelectronic assembly 10 or package in accordance with the above description and a circuit panel 108 having a plurality of contacts 144 at a surface 112 thereof which are aligned with and joined to the second terminals 142 of the microelectronic assembly 10 through electrically conductive joining elements 146. The joining elements can include one or more of electrically conductive masses 146 such as comprised of a material as described above in connection with masses 136, or which may include electrically conductive solid metal posts, e.g., posts having monolithic metal regions consisting essentially of copper and which are generally cylindrical or frustoconical in shape, and generally rectangular or trapezoidal when viewed in cross-section.

FIG. 3 illustrates an assembly 14 of the microelectronic package 10, in which a plurality of microelectronic assemblies 10 or packages are stacked and electrically coupled with one another through their respective first terminals 141, second terminals 142 aligned therewith and electrically conductive joining elements 16 contacting respective pairs of first and second terminals. One of the microelectronic assemblies 10 can have second terminals 142 coupled with the contacts of a circuit panel 108, as described above with reference to FIG. 2.

Referring to FIG. 4, in a microelectronic assembly 20 or package according to a variation of the assembly 10 described above, a second microelectronic element 220 is provided overlying a first surface 101 of the first support element 102, and the first terminals may be omitted from the microelectronic assembly 20. The second microelectronic element 220 may be electrically coupled with the electrically conductive second elements 152 through wiring 154 provided on the first support element 102, and through the masses 136. The second microelectronic element 220 may be electrically coupled with the second terminals 142 through the wiring 154, the masses 136, and the second elements 152. In another variation (not shown), the second terminals may be omitted from the microelectronic assembly 20 whereas the first terminals will be provided in addition to wiring 154 generally at surface 101 of the second support element 102. In such case, the second microelectronic element 220 may be electrically coupled with first terminals (e.g., at locations in accordance with FIG. 1) and be electrically coupled therewith through wiring 154 provided on the first support element 102 and the masses 136.

Figure 5:
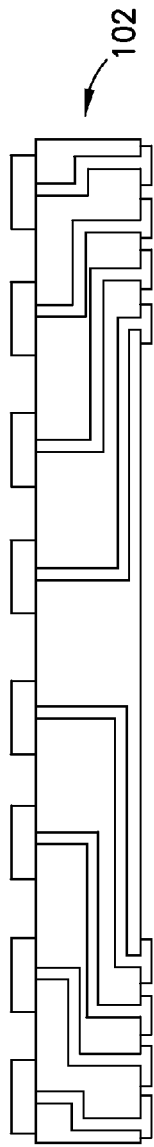
Figure 6:
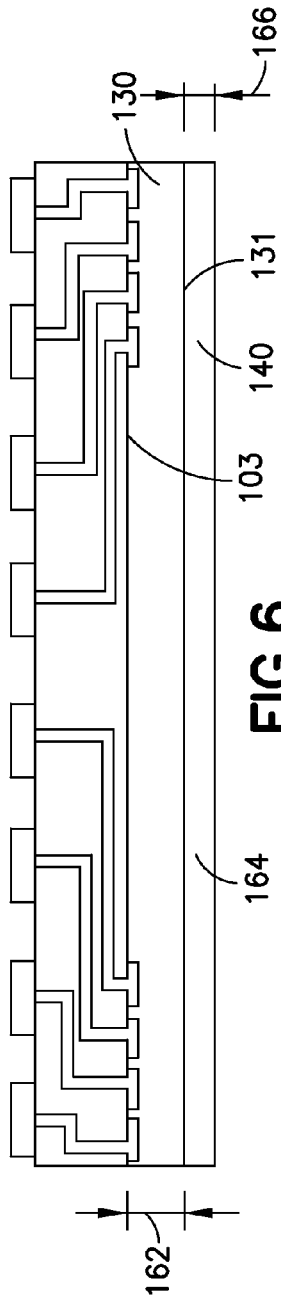

Turning now to FIGS. 5 through 12, a method will now be described for fabricating a microelectronic assembly in accordance with an embodiment of the invention. As seen in FIG. 5, a first support element 102 or interposer is provided, having features as described above. As seen in FIG. 6, a first layer 130 of photo-imageable material is provided overlying a second surface 103 of the first support element 102. In one example, the photo-imageable material can be a negative tone photoresist material such as SU8, which may more specifically be a material such as SU8-2150, which can have a thickness 162 ranging from about 20 microns and up to 650 microns, and will be a permanent layer once it has crosslinked by appropriate processing, e.g., thermal or radiation treatment after patterning. The photo-imageable material of the first layer, e.g., SU8, can be applied to the second surface 103 or to overlie the second surface 103 of the support element by spin-on or roller-coat method, among others. In one embodiment, the thickness 162 can be 200 microns. After applying the first layer 130, a temporary layer 164 of a photo-imageable material is applied to the surface 131, or to overlie the surface 131 of the first layer. In one example, the temporary layer can be a dry film which is removable after patterning. The temporary layer 164 can range in thickness 166 between 50 microns and 300 microns. In one example, the thickness 166 can be 100 microns.

Figure 7:
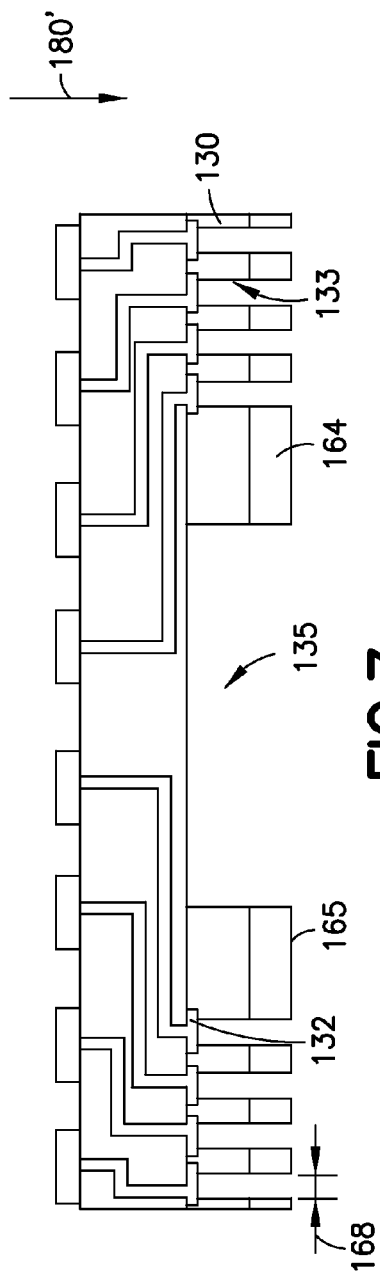

Thereafter, as seen in FIG. 7, the temporary layer 164 is patterned such as by photolithography to form apertures therein. The apertures can then be used to pattern the first layer 130, such as by etching or photolithography to form the openings 133 therein in alignment with the patterns in the temporary layer, wherein surfaces of first elements 132 are at least partially exposed within the openings 133. In one example, lateral dimensions 168 in directions 178, 179 (FIG. 1) of the openings 133 are constant or monotonically increasing in a direction 180' extending above the first elements 132 to a surface 165 of the temporary layer. At the same time that the openings 133 are being formed, or at a different time, the same or similar processing can be used to form a larger opening 135 in the temporary layer 164 and the first layer 130, the opening 135 having lateral dimensions in directions 178 and 179 which are larger than microelectronic element 120 (FIG. 1) such that the opening 135 at least partially accommodates microelectronic element 120.

Figure 8:
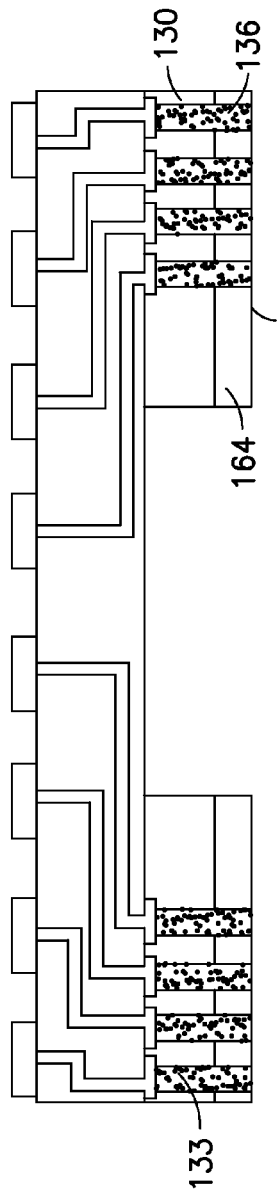

In the stage seen in FIG. 8, the openings 133 can be filled with masses 136 of electrically conductive material such as, for example, a metallic paste or metal flake or metal particle material which is mixed with one or more of a flux, solvent or other volatile material, or binder, the material being reflowable or otherwise being subject to harden with sufficient thermal treatment. In particular examples, without limitation, the material can be a paste containing particles of one or more of solder, tin, indium, silver, gold, or copper. In another example, the material can be a permanently curable or hardenable conductive material. In one example, the openings 133 can be filled by one or more of screening, stenciling or dispensing of a conductive paste using a tool having a head which passes over the surface 165 of the temporary layer 164.

Figure 9:
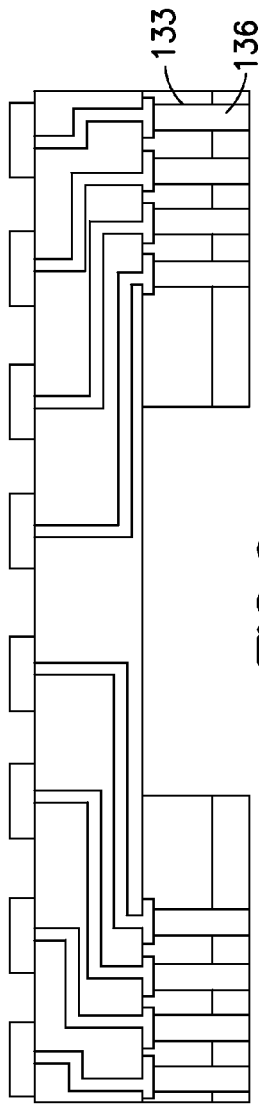

FIG. 9 depicts an optional stage of heating the structure shown therein to cause reflowing of the masses 136 of electrically conductive material within the openings 133 when the material deposited therein is a reflowable material. Alternatively, when the electrically conductive material is a permanently curable or hardenable conductive material, some amount of drying or heating can be applied, if needed, to partially cure the material. In one example, such curable conductive material can be partially cured by heating to a temperature below a glass transition temperature of a polymeric material of which the conductive material is comprised. Alternatively, in a variation of the above-described process, the openings 133 can be filled by injecting a bond metal in a molten state, e.g., solder, tin, indium or a eutectic mixture, into the openings 133, such as by batch processing.

Figure 10:
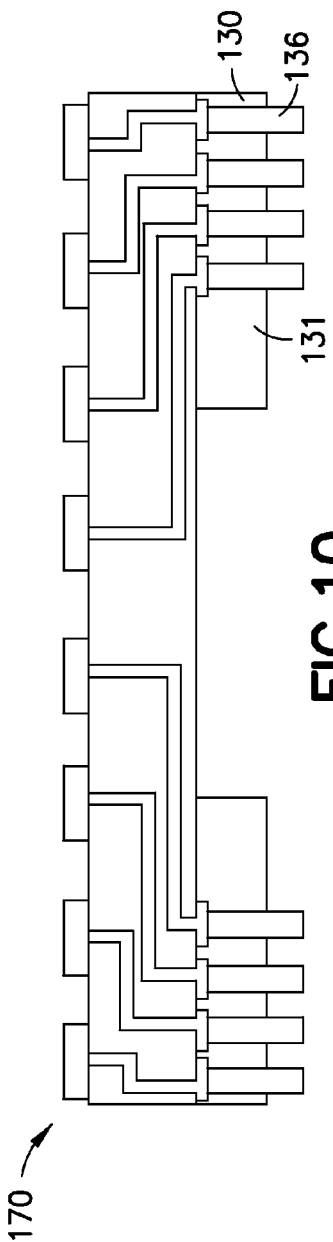
Figure 11:
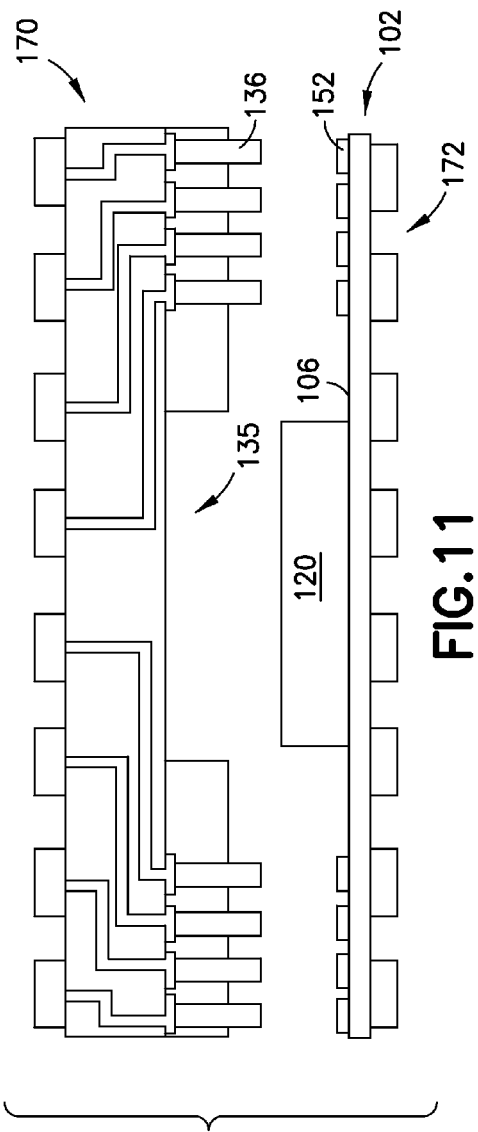

Referring to FIG. 10, the temporary layer can now be removed so that portions of the masses 136 project above a surface 131 of the first layer 130. In one example, the temporary layer is removed by dissolution, e.g., by washing or etching selectively with respect to a material of the first layer 130. In one example, a first subassembly 170 comprising the support element 102, first layer 130 thereon and the masses 136 of conductive material projecting above a surface 131 of the first layer is ready for further assembly with another component. Thus, as seen in FIG. 11, masses 136 of the conductive material are aligned with corresponding electrically conductive second elements 152 at a surface 106 of a second support element 104 of a second subassembly 172. Opening 135 in the first layer 130 is aligned with microelectronic element 120. Then, the first and second subassemblies 170, 172 can be brought together such that the masses 136 contact the second elements 152 or are disposed in close proximity. When the masses 136 comprise a reflowable material, the masses 136 can then be reflowed to form connections with the second elements 152 having an appearance as seen in FIG. 1, in which bulbous portions 138 of the masses 136 appear above the surface 131 of the first layer. Alternatively, masses 136 of curable or hardenable material can be cured or hardened after being brought into contact with the second elements 152 to form permanent connections therewith.

Figure 12:
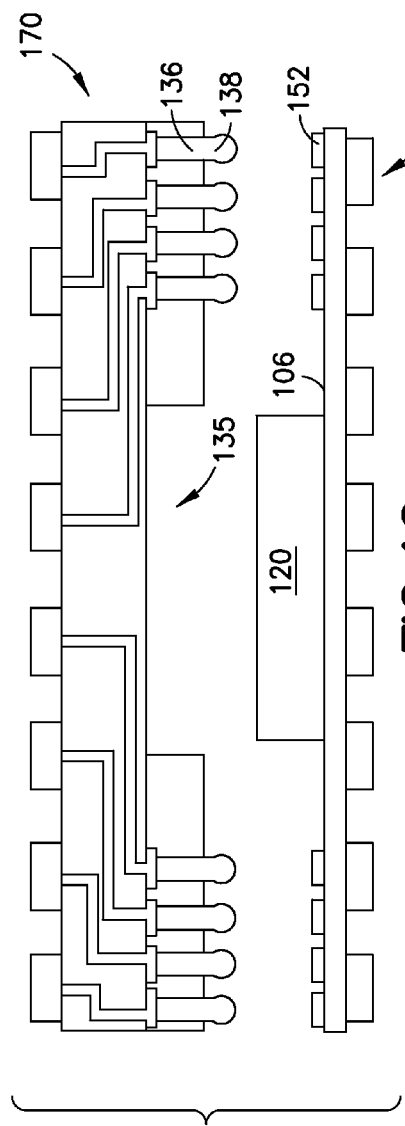

Referring to FIG. 12, in a variation of the above-described processing, the first subassembly 170 having reflowable masses 136 can be heated to a reflow temperature prior to assembly of the first and second subassemblies 170, 172. In such way, portions of the masses projecting above the surface 131 of the first layer can be reflowed to form bulbous portions 138. Further assembling of the first and second subassemblies with one another can then be carried out to form microelectronic assembly (FIG. 1), such as by aligning the masses 136 with the corresponding second elements 152 and aligning the opening 135 with the microelectronic element 120, bringing the bulbous portions 138 of the masses in contact with the second elements 152 and then reflowing at least the bulbous portions 138 to form connections between the masses 136 and the second elements 152.

Figure 13:
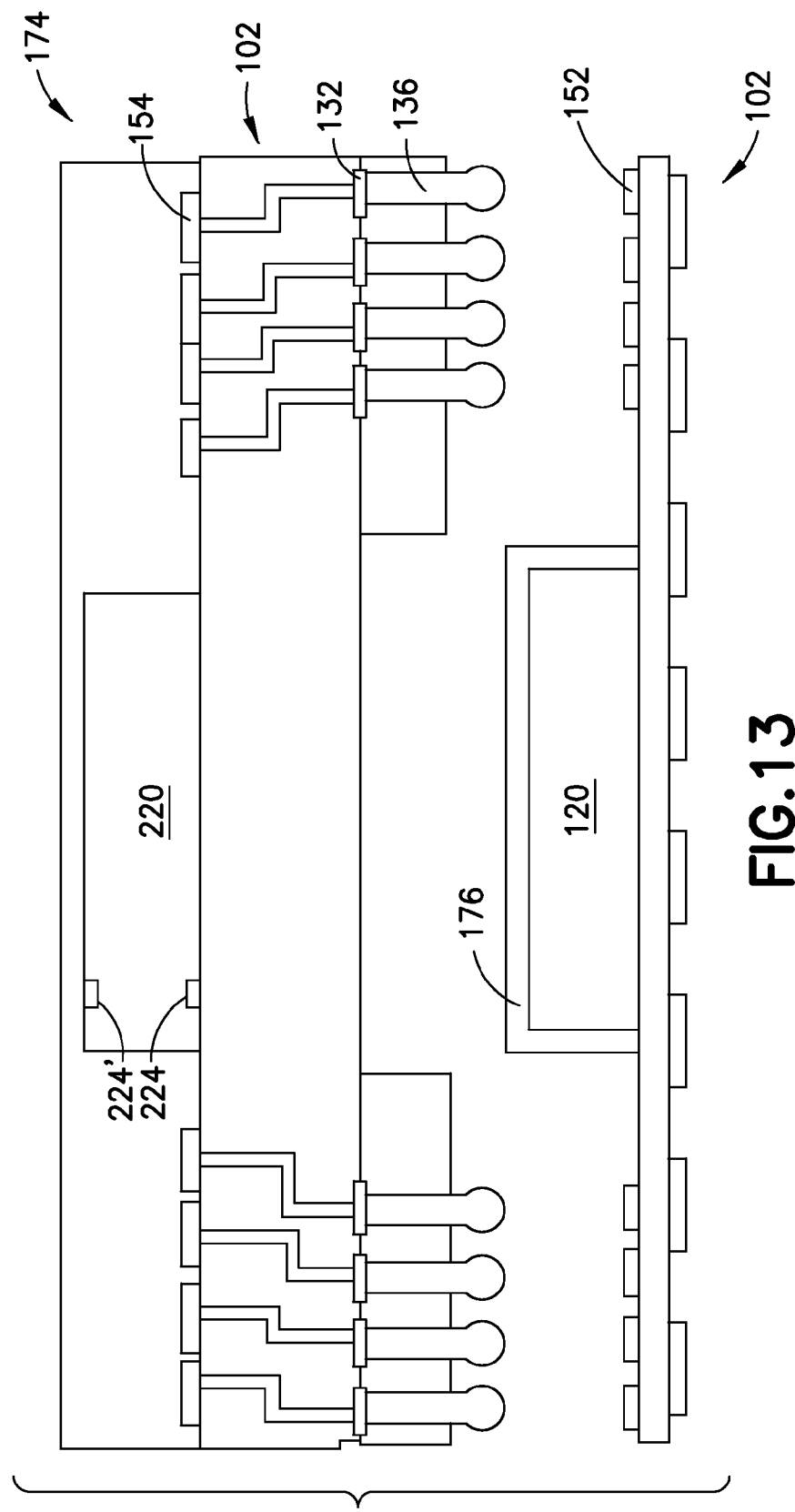
FIG. 13 is a sectional view illustrating a stage in a method of fabricating a microelectronic assembly in accordance with a variation of the method illustrated in FIGS. 5 through 12.

Thereafter, with additional reference to FIG. 1, an encapsulation 150 can be formed using an encapsulant material such as described above. In one example, the assembly 10 can be placed in a mold and an encapsulant injected into a space between the first and second subassemblies 170, 172 such that the encapsulant contacts surfaces of the masses 136, which may be straight portions or bulbous portions 138 of the masses. The encapsulant may contact the surface 131 of the first layer of photo-imageable material and may contact the second surface 106 of the second support element. The encapsulant may contact surfaces 127 and 129 of the microelectronic element 120. Curing or partial curing of the encapsulant can be effected while the assembly is still in the mold or the encapsulant can be cured by subsequent processing. In one example applying to any or all microelectronic assemblies 10, 20 described herein, surfaces 127, 129 of microelectronic element 120 can be partially or fully covered by a second encapsulation 176 as seen in FIG. 13 prior to uniting of the first and second subassemblies 170, 172 to form assembly 20. The encapsulation 150 may be formed in contact with the microelectronic element 120 and/or in contact with a second encapsulation 176 which is formed on a face of the microelectronic element 120.

FIG. 13 depicts a stage in fabrication of a microelectronic assembly 20 as seen in FIG. 4 in accordance with a variation of the above-described processing. As seen in FIG. 13, a microelectronic subassembly 174 can comprise first support element 102 and microelectronic element 220 mounted to a surface 101 which faces in an outwardly direction of the assembly 20 to be constructed thereof. Contacts 224 and/or 224' of microelectronic element 220 may be electrically coupled with the masses 136 of conductive material through wiring 154 on the first support element 102 and through first elements 132. Then, the masses 136 can be aligned and joined with corresponding second elements 152 on the second subassembly in a manner such as described above with reference to FIG. 11 or FIG. 12. Further processing to form an encapsulation 150 can be performed in a manner as described above.

Figure 14:
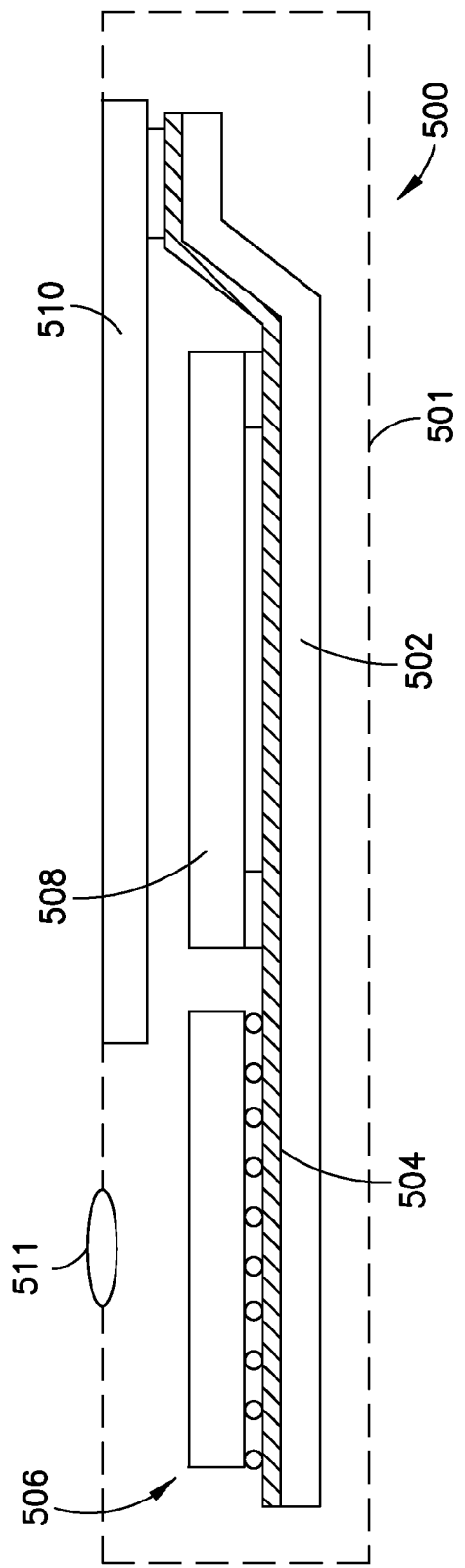
FIG. 14 is a sectional view illustrating a microelectronic package or assembly as further incorporated in and which may be utilized in a system according to an embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, referring to FIG. 14, a system 500 in accordance with a further embodiment of the invention includes a structure 506 as described above in conjunction with other electronic components 508 and 510. In the example depicted, component 508 is a semiconductor chip whereas component 510 is a display screen, but any other components can be used. Of course, although only two additional components are depicted in FIG. 14 for clarity of illustration, the system may include any number of such components. The structure 506 as described above may be, for example, a microelectronic package as discussed above in the foregoing or may be a microelectronic assembly such as discussed above with respect to FIG. 1, 2, 3 or 4. Structure 506 and components 508 and 510 are mounted in a common housing 501, schematically depicted in broken lines, and are electrically interconnected with one another as necessary to form the desired circuit. In the exemplary system shown, the system includes a circuit panel 502 such as a flexible printed circuit board, and the circuit panel includes numerous conductors 504, of which only one is depicted in FIG. 14, interconnecting the components with one another. However, this is merely exemplary; any suitable structure for making electrical connections can be used. The housing 501 is depicted as a portable housing of the type usable, for example, in a cellular telephone or personal digital assistant, and screen 510 is exposed at the surface of the housing. Where structure 506 includes a light-sensitive element such as an imaging chip, a lens 511 or other optical device also may be provided for routing light to the structure. Again, the simplified system shown in FIG. 14 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A microelectronic assembly, comprising:
   first and second support elements each having a first surface facing in an outwardly direction of the assembly and each having a second surface facing in an inwardly direction of the assembly towards the second surface of the other of the first and second support elements respectively, and including at least one of: first terminals at the first surface of the first support element, or second terminals at the first surface of the second support element;
   electrically conductive first elements at the second surface of the first support element;
   a patterned layer of photo-imageable material overlying the second surface of the first support element and having openings aligned with the electrically conductive first elements, each opening having a cross-sectional dimension which is constant or increasing with a height from the second surface of the first support element;
   electrically conductive masses of bonding material electrically coupled with and projecting above the electrically conductive first elements through the corresponding openings of the patterned layer, each mass having a cross-sectional dimension which is defined by a cross-sectional dimension of the corresponding opening through which it projects;
   a microelectronic element mounted to the second surface of one of the first or the second support elements;
   electrically conductive second elements at the second surface of the second support element, the electrically conductive second elements electrically coupled with the masses and electrically coupled with the first elements through the masses; and
   an encapsulation overlying the second surface of the second support element, a surface of the patterned layer and contacting at least some of the masses, the masses extending through at least a portion of the encapsulation.

2. The microelectronic assembly as claimed in claim 1, wherein the assembly comprises the first terminals at the first surface of the first support element, and the second terminals at the first surface of the second support element, the first terminals being electrically coupled with the second terminals through the electrically conductive first elements, the electrically conductive second elements, and the masses therebetween, or
   the assembly includes one of:
   the first terminals at the first surface of the first support element, the first terminals being electrically coupled with the electrically conductive second elements through the masses therebetween; or
   the second terminals at the first surface of the second support element, the second terminals being electrically coupled with the electrically conductive first elements through the masses therebetween.

3. The microelectronic assembly as claimed in claim 1, wherein the masses comprise bulbous portions where the masses extend through the at least a portion of the encapsulation.

4. The microelectronic assembly as claimed in claim 2, wherein the encapsulation is formed in contact with the surface of the patterned layer and in contact with the second surface of the second support element.

5. The microelectronic assembly as claimed in claim 2, wherein the microelectronic element has a face facing away from the second support element, and the encapsulation is a first encapsulation formed in contact with at least one of: the face of the microelectronic element or a second encapsulation formed on the face of the microelectronic element.

6. The microelectronic assembly as claimed in claim 5, wherein the microelectronic assembly comprises the second encapsulation formed on the face of the microelectronic element, and the first encapsulation is formed in contact with the second encapsulation.

7. A stacked multi-chip microelectronic assembly including the microelectronic assembly as claimed in claim 2, and a microelectronic package overlying the first surface of the first support element, the microelectronic package having terminals connected with the first terminals of the microelectronic assembly.

8. The stacked multi-chip microelectronic assembly as claimed in claim 7, wherein a minimum pitch of the first terminals is larger than a minimum pitch of the electrically conductive first elements.

9. The stacked multi-chip microelectronic assembly as claimed in claim 8, wherein the minimum pitch of the first terminals is the same as a minimum pitch of the second terminals.

10. A stacked multi-chip microelectronic assembly including the microelectronic assembly as claimed in claim 2, wherein the microelectronic assembly includes the second terminals but not the first terminals, and the second terminals are electrically coupled with the electrically conductive first elements through the masses therebetween.

11. The stacked multi-chip microelectronic assembly as claimed in claim 10, further comprising a second microelectronic element mounted to the first surface of the first support element, and a second encapsulation contacting the first surface of the first support element and surfaces of the second microelectronic element.

12. The stacked multi-chip microelectronic assembly as claimed in claim 11, wherein the second microelectronic element is electrically coupled with the second terminals through the electrically conductive first elements and through the masses which are electrically coupled therebetween.

* * * * *